US 8,233,849 B2

(12) United States Patent
Trachewsky et al.

(10) Patent No.: US 8,233,849 B2
(45) Date of Patent: *Jul. 31, 2012

(54) RF TRANSMITTER HAVING MULTIPLE CONSTANT TRANSMIT POWER LEVELS

(75) Inventors: Jason A. Trachewsky, Menlo Park, CA (US); Tim Robinson, Boulder Creek, CA (US); George Kondylis, Palo Alto, CA (US); Ling Su, Cupentino, CA (US)

(73) Assignee: Broadcom Corporation, Irvine, CA (US)

( * ) Notice: Subject to any disclaimer, the term of this patent is extended or adjusted under 35 U.S.C. 154(b) by 685 days.

This patent is subject to a terminal disclaimer.

(21) Appl. No.: 12/392,773

(22) Filed: Feb. 25, 2009

(65) Prior Publication Data

US 2009/0154596 A1    Jun. 18, 2009

Related U.S. Application Data

(63) Continuation of application No. 10/741,665, filed on Dec. 19, 2003, now Pat. No. 7,555,268.

(51) Int. Cl.
*H04B 1/66* (2006.01)
*H04B 17/00* (2006.01)

(52) U.S. Cl. .......... 455/102; 455/115.3; 455/115.4; 455/127.2; 455/522; 375/297

(58) Field of Classification Search .......... 455/67.11, 455/102, 115.1, 115.3, 127.1, 127.2, 423, 455/425, 522, 552.1, 553.1, 115.4; 375/295, 375/297, 298, 300, 302, 309, 130, 140
See application file for complete search history.

(56) References Cited

U.S. PATENT DOCUMENTS 6,735,420 B2 * 5/2004 Baldwin .......... 455/127.2
7,072,390 B1 * 7/2006 Sorrells et al. .......... 375/295

* cited by examiner

*Primary Examiner* — Quochien B Vuong
(74) *Attorney, Agent, or Firm* — Garlick & Markison

(57) ABSTRACT

A radio frequency transmitter includes a baseband transmit processing module, a mixing module, a power amplifier, a transmit power sense module, and a transmit power control module. The baseband transmit processing module is operably coupled to encode outbound data into outbound baseband signals in accordance with one of a plurality of encoding protocols. The mixing module is operably coupled to convert the outbound baseband signals into outbound radio frequency signals. The power amplifier is operably coupled to amplify the outbound RF signals prior to transmission to produce amplified outbound RF signals. The transmit power sense module is operably coupled to sense the amplified outbound RF signals to provide a transmit signal strength indication (TSSI). The transmit power control module is operably coupled to adjust gain of the baseband transmit processing module, the mixing module, and/or the power amplifier based on the TSSI and the particular encoding protocol used to produce the baseband signals.

9 Claims, 7 Drawing Sheets

| encoding protocol | desired TX power | selected TSSI | selected gain |
|---|---|---|---|
| OFDM | 13.5 dBm | adjusted TSSI | adjusted gain |
| DSSS | 17.5 dBm | TSSI 104 | gain settings |
| CCK | 17.5 dBm | TSSI 104 | gain settings | transmit power control module 102 transmit power control module 102

RF TRANSMITTER HAVING MULTIPLE CONSTANT TRANSMIT POWER LEVELS

This patent application is claiming priority under 35 USC §120 as a continuing patent application of co-pending patent application entitled RF TRANSMITTER HAVING MULTIPLE CONSTANT TRANSMIT POWER LEVELS, having a filing date of Dec. 19, 2003, and a Ser. No. 10/741,665.

BACKGROUND OF THE INVENTION

1. Technical Field of the Invention

This invention relates generally to wireless communication devices and more particularly to radio frequency transmitters used within such wireless communication systems.

2. Description of Related Art

Communication systems are known to support wireless and wire lined communications between wireless and/or wire lined communication devices. Such communication systems range from national and/or international cellular telephone systems to the Internet to point-to-point in-home wireless networks. Each type of communication system is constructed, and hence operates, in accordance with one or more communication standards. For instance, wireless communication systems may operate in accordance with one or more standards including, but not limited to, IEEE 802.11, Bluetooth, advanced mobile phone services (AMPS), digital AMPS, global system for mobile communications (GSM), code division multiple access (CDMA), local multi-point distribution systems (LMDS), multi-channel-multi-point distribution systems (MMDS), and/or variations thereof.

Depending on the type of wireless communication system, a wireless communication device, such as a cellular telephone, two-way radio, personal digital assistant (PDA), personal computer (PC), laptop computer, home entertainment equipment, et cetera communicates directly or indirectly with other wireless communication devices. For direct communications (also known as point-to-point communications), the participating wireless communication devices tune their receivers and transmitters to the same channel or channels (e.g., one of the plurality of radio frequency (RF) carriers of the wireless communication system) and communicate over that channel(s). For indirect wireless communications, each wireless communication device communicates directly with an associated base station (e.g., for cellular services) and/or an associated access point (e.g., for an in-home or in-building wireless network) via an assigned channel. To complete a communication connection between the wireless communication devices, the associated base stations and/or associated access points communicate with each other directly, via a system controller, via the public switch telephone network, via the Internet, and/or via some other wide area network.

For each wireless communication device to participate in wireless communications, it includes a built-in radio transceiver (i.e., receiver and transmitter) or is coupled to an associated radio transceiver (e.g., a station for in-home and/or in-building wireless communication networks, RF modem, etc.). As is known, the transmitter includes a data modulation stage, one or more intermediate frequency stages, and a power amplifier. The data modulation stage converts raw data into baseband signals in accordance with a particular wireless communication standard. The one or more intermediate frequency stages mix the baseband signals with one or more local oscillations to produce RF signals. The power amplifier amplifies the RF signals prior to transmission via an antenna.

As is also known, the receiver is coupled to the antenna and includes a low noise amplifier, one or more intermediate frequency stages, a filtering stage, and a data recovery stage. The low noise amplifier receives inbound RF signals via the antenna and amplifies them. The one or more intermediate frequency stages mix the amplified RF signals with one or more local oscillations to convert the amplified RF signal into baseband signals or intermediate frequency (IF) signals. The filtering stage filters the baseband signals or the IF signals to attenuate unwanted out of band signals to produce filtered signals. The data recovery stage recovers raw data from the filtered signals in accordance with the particular wireless communication standard.

As is further known, the transmitter of a wireless communication device transmits RF signals that represent baseband processed data to the receiver of another wireless communication device directly or through an access point, or base station. The particular type of baseband processing used to prepare the data for radio frequency transmission and subsequent data recapture by the receiver is dependent upon the standard, or standards, being supported by the wireless communication devices and upon the received signal strength of the RF signals. For example, if the standard being supported is IEEE802.11g, the baseband processing may include encoding data at 1 or 2 megabits-per-second using a direct sequence spread spectrum (DSSS) encoding protocol, a 5.5 or 11 megabits-per-second complimentary code keying (CCK) encoding protocol, or a 6, 9, 12, 18, 24, 36, 48, or 54 orthogonal frequency division multiplexing (OFDM) encoding protocol.

The particular encoding protocol selected is at least partially based on received signal strength indication (RSSI). In general, the weaker the signal strength of the received RF signal, the lower the data rate. As is known, the transmitter transmits RF signals at a fixed output power level (e.g., 10 dBm) such that the decrease in receive signal strength is primarily due to physical distance between the transmitter and receiver. Thus, the greater the distance, the weaker the received signal will be, requiring a lower data rate encoding protocol to be used. Further, when the received signals are weak, the data recovery circuitry within the receivers may have difficulty recapturing the data resulting in a retransmission of the data or loss of data, either of which reduces data throughput.

One solution for improving received signal strength is to raise the transmit power level such that the received signal strength would correspondingly increase. While this would help for weaker received signal strengths, it is overkill for stronger received signals and would unnecessarily consume additional power in the transmitter, which, for battery operated wireless communication devices is extremely detrimental.

Therefore, a need exists for a method and apparatus for adjusting transmit power levels, while maintaining the particular transmit power level constant, without increasing power consumption and further improving data throughput.

BRIEF SUMMARY OF THE INVENTION

The RF transmitter having multiple constant transmit power levels of the present invention substantially meets these needs and others. In one embodiment, a radio frequency transmitter includes a baseband transmit processing module, a mixing module, a power amplifier, a transmit power sense module, and a transmit power control module. The baseband transmit processing module is operably coupled to encode outbound data into outbound baseband signals in accordance with one of a plurality of encoding protocols. The mixing module is operably coupled to convert the outbound baseband signals into outbound radio frequency signals. The power amplifier is operably coupled to amplify the outbound RF signals prior to transmission to produce amplified outbound RF signals. The transmit power sense module is operably coupled to sense the amplified outbound RF signals to provide a transmit signal strength indication (TSSI). The transmit power control module is operably coupled to adjust gain of the baseband transmit processing module, the mixing module, and/or the power amplifier based on the TSSI and the particular encoding protocol used to produce the baseband signals. For instance, when a $1^{st}$ encoding protocol of the plurality of encoding protocols is used, the transmit power of the RF transmitter is regulated to a $1^{st}$ power level and for a $2^{nd}$ encoding protocol the transmit power level of the RF transmitter is set at a $2^{nd}$ power level, where the $1^{st}$ power level is greater than the $2^{nd}$ power level. With such an RF transmitter, the transmit power may be adjusted based on the encoding protocol such that for higher data rate protocols, which are generally used when the received signal strength is greater, the transmit power level may be set at a lower level than when the encoding protocol is a lower data rate, which corresponds to weaker received signals.

In another embodiment, a method for providing multiple constant output power levels for a radio frequency transmitter begins by sensing a power level of outbound radio frequency signals to produce a sensed power level. The processing then continues by adjusting the sensed power level to a nominal sense power level based on a power level offset that corresponds to a desired output power level of the multiple constant output power levels. The processing continues by producing a nominal transmit gain setting based on the nominal sensed power level. The processing continues by adjusting the nominal transmit gain setting to produce an actual transmit gain setting based on a gain offset that corresponds to the desired output power level of the multiple constant output power levels. With such a method, which may be implemented by an apparatus, output power levels of radio frequency transmitters may be adjusted corresponding to the particular baseband encoding protocol that is supported by the radio frequency transmitter.

DETAILED DESCRIPTION OF THE INVENTION

Figure 1:
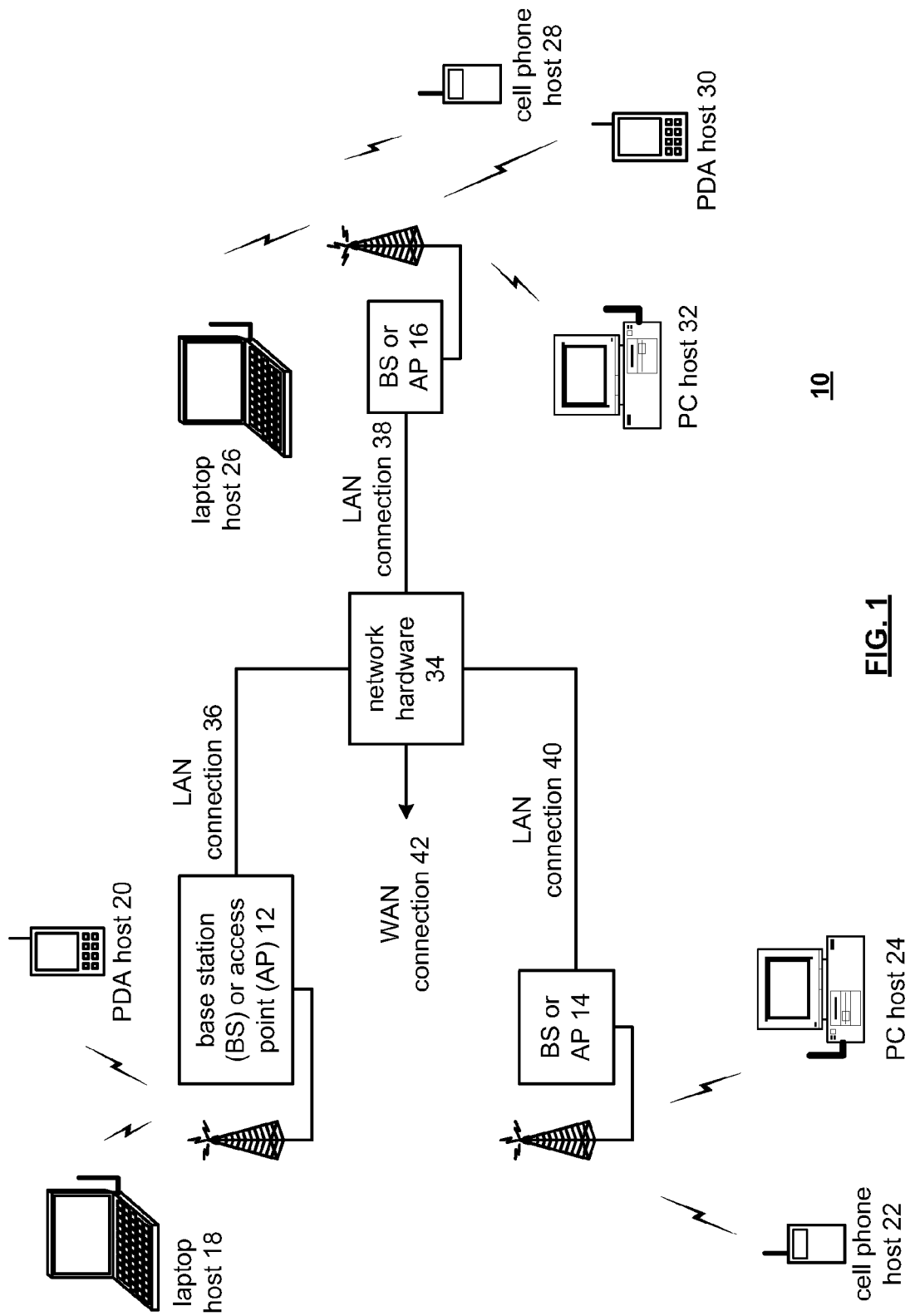
FIG. 1 is a schematic block diagram of a wireless communication system in accordance with the present invention.

FIG. 1 is a schematic block diagram illustrating a communication system 10 that includes a plurality of base stations and/or access points 12-16, a plurality of wireless communication devices 18-32 and a network hardware component 34. The wireless communication devices 18-32 may be laptop host computers 18 and 26, personal digital assistant hosts 20 and 30, personal computer hosts 24 and 32 and/or cellular telephone hosts 22 and 28. The details of the wireless communication devices will be described in greater detail with reference to FIG. 2.

The base stations or access points 12-16 are operably coupled to the network hardware 34 via local area network connections 36, 38 and 40. The network hardware 34, which may be a router, switch, bridge, modem, system controller, et cetera provides a wide area network connection 42 for the communication system 10. Each of the base stations or access points 12-16 has an associated antenna or antenna array to communicate with the wireless communication devices in its area. Typically, the wireless communication devices register with a particular base station or access point 12-14 to receive services from the communication system 10. For direct connections (i.e., point-to-point communications), wireless communication devices communicate directly via an allocated channel.

Typically, base stations are used for cellular telephone systems and like-type systems, while access points are used for in-home or in-building wireless networks. Regardless of the particular type of communication system, each wireless communication device includes a built-in radio and/or is coupled to a radio. The radio includes a highly linear amplifier and/or programmable multi-stage amplifier as disclosed herein to enhance performance, reduce costs, reduce size, and/or enhance broadband applications.

Figure 2:
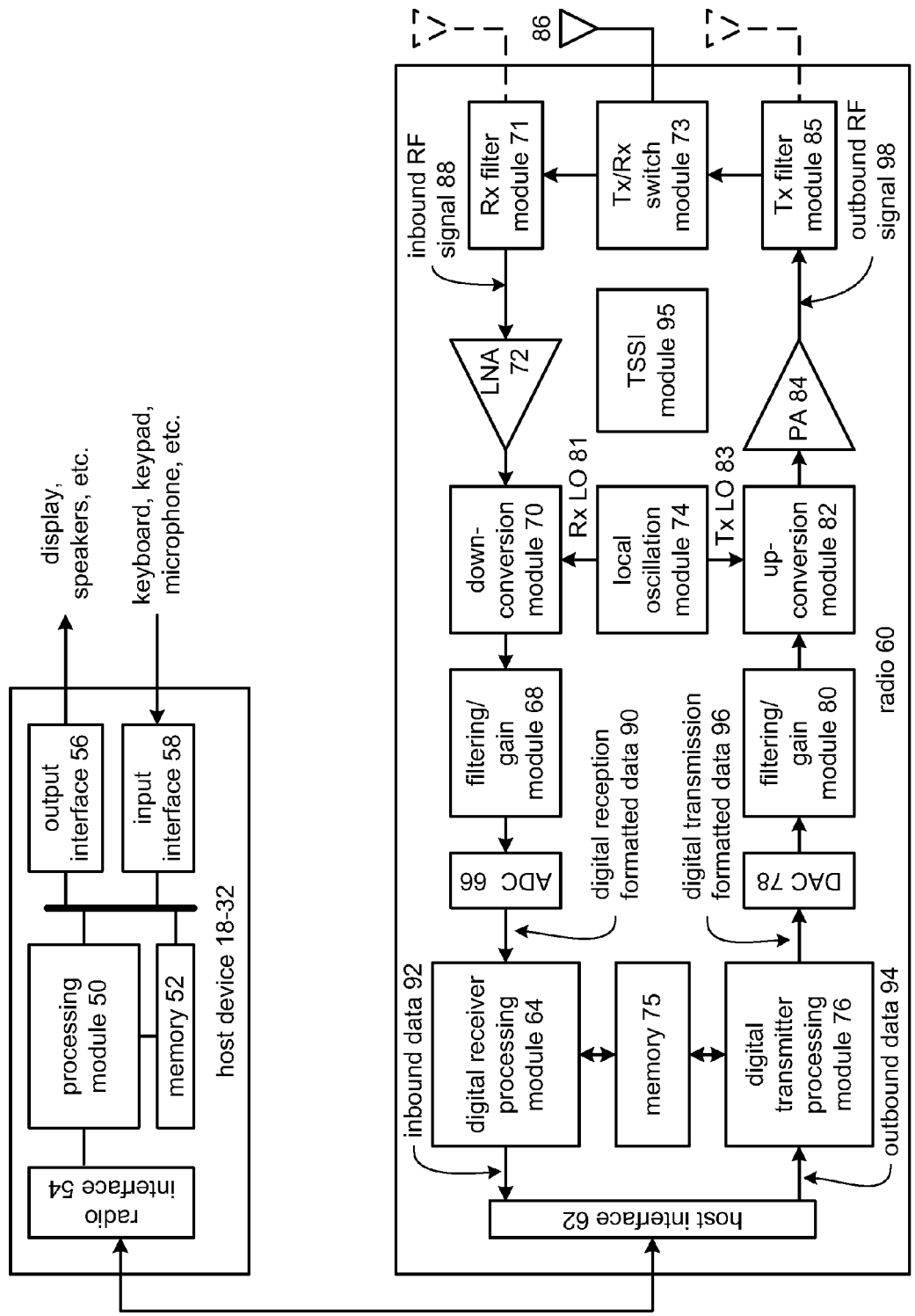
FIG. 2 is a schematic block diagram of a wireless communication device in accordance with the present invention.

FIG. 2 is a schematic block diagram illustrating a wireless communication device that includes the host device 18-32 and an associated radio 60. For cellular telephone hosts, the radio 60 is a built-in component. For personal digital assistants hosts, laptop hosts, and/or personal computer hosts, the radio 60 may be built-in or an externally coupled component.

As illustrated, the host device 18-32 includes a processing module 50, memory 52, radio interface 54, input interface 58 and output interface 56. The processing module 50 and memory 52 execute the corresponding instructions that are typically done by the host device. For example, for a cellular telephone host device, the processing module 50 performs the corresponding communication functions in accordance with a particular cellular telephone standard.

The radio interface 54 allows data to be received from and sent to the radio 60. For data received from the radio 60 (e.g., inbound data), the radio interface 54 provides the data to the processing module 50 for further processing and/or routing to the output interface 56. The output interface 56 provides connectivity to an output display device such as a display, monitor, speakers, et cetera such that the received data may be displayed. The radio interface 54 also provides data from the processing module 50 to the radio 60. The processing module 50 may receive the outbound data from an input device such as a keyboard, keypad, microphone, et cetera via the input interface 58 or generate the data itself. For data received via the input interface 58, the processing module 50 may perform a corresponding host function on the data and/or route it to the radio 60 via the radio interface 54.

Radio 60 includes a host interface 62, digital receiver processing module 64, an analog-to-digital converter 66, a filtering/gain module 68, an IF mixing down conversion stage 70, a receiver filter 71, a low noise amplifier 72, a transmitter/receiver switch 73, a local oscillation module 74, memory 75, a digital transmitter processing module 76, a digital-to-analog converter 78, a filtering/gain module 80, an IF mixing up conversion stage 82, a power amplifier 84, a transmitter filter module 85, a transmit signal strength indication (TSSI) module 95, and an antenna 86. The antenna 86 may be a single antenna that is shared by the transmit and receive paths as regulated by the Tx/Rx switch 73, or may include separate antennas for the transmit path and receive path. The antenna implementation will depend on the particular standard to which the wireless communication device is compliant.

The digital receiver processing module 64 and the digital transmitter processing module 76, in combination with operational instructions stored in memory 75, execute digital receiver functions and digital transmitter functions, respectively. The digital receiver functions include, but are not limited to, digital intermediate frequency to baseband conversion, demodulation, constellation demapping, decoding, and/or descrambling. The digital transmitter functions include, but are not limited to, scrambling, encoding, constellation mapping, modulation, and/or digital baseband to IF conversion. The digital receiver and transmitter processing modules 64 and 76 may be implemented using a shared processing device, individual processing devices, or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The memory 75 may be a single memory device or a plurality of memory devices. Such a memory device may be a read-only memory, random access memory, volatile memory, non-volatile memory, static memory, dynamic memory, flash memory, and/or any device that stores digital information. Note that when the processing module 64 and/or 76 implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry.

In operation, the radio 60 receives outbound data 94 from the host device via the host interface 62. The host interface 62 routes the outbound data 94 to the digital transmitter processing module 76, which processes the outbound data 94 in accordance with a particular wireless communication standard (e.g., IEEE 802.11 Bluetooth, et cetera) to produce digital transmission formatted data 96. The digital transmission formatted data 96 will be a digital base-band signal or a digital low IF signal, where the low IF typically will be in the frequency range of one hundred kilohertz to a few megahertz.

The digital-to-analog converter 78 converts the digital transmission formatted data 96 from the digital domain to the analog domain. The filtering/gain module 80 filters and/or adjusts the gain of the analog signal prior to providing it to the IF mixing stage 82. The IF mixing stage 82 converts the analog baseband or low IF signal into an RF signal based on a transmitter local oscillation 83 provided by local oscillation module 74. The power amplifier 84 amplifies the RF signal to produce outbound RF signal 98, which is filtered by the transmitter filter module 85. The antenna 86 transmits the outbound RF signal 98 to a targeted device such as a base station, an access point and/or another wireless communication device.

The radio 60 also receives an inbound RF signal 88 via the antenna 86, which was transmitted by a base station, an access point, or another wireless communication device. The antenna 86 provides the inbound RF signal 88 to the receiver filter module 71 via the Tx/Rx switch 73, where the Rx filter 71 bandpass filters the inbound RF signal 88. The Rx filter 71 provides the filtered RF signal to low noise amplifier 72, which amplifies the signal 88 to produce an amplified inbound RF signal. The low noise amplifier 72 provides the amplified inbound RF signal to the IF mixing module 70, which directly converts the amplified inbound RF signal into an inbound low IF signal or baseband signal based on a receiver local oscillation 81 provided by local oscillation module 74. The down conversion module 70 provides the inbound low IF signal or baseband signal to the filtering/gain module 68. The filtering/gain module 68 filters and/or gains the inbound low IF signal or the inbound baseband signal to produce a filtered inbound signal.

The analog-to-digital converter 66 converts the filtered inbound signal from the analog domain to the digital domain to produce digital reception formatted data 90. The digital receiver processing module 64 decodes, descrambles, demaps, and/or demodulates the digital reception formatted data 90 to recapture inbound data 92 in accordance with the particular wireless communication standard being implemented by radio 60. The host interface 62 provides the recaptured inbound data 92 to the host device 18-32 via the radio interface 54.

As one of average skill in the art will appreciate, the wireless communication device of FIG. 2 may be implemented using one or more integrated circuits. For example, the host device may be implemented on one integrated circuit, the digital receiver processing module 64, the digital transmitter processing module 76 and memory 75 may be implemented on a second integrated circuit, and the remaining components of the radio 60, less the antenna 86, may be implemented on a third integrated circuit. As an alternate example, the radio 60 may be implemented on a single integrated circuit. As yet another example, the processing module 50 of the host device and the digital receiver and transmitter processing modules 64 and 76 may be a common processing device implemented on a single integrated circuit. Further, the memory 52 and memory 75 may be implemented on a single integrated circuit and/or on the same integrated circuit as the common processing modules of processing module 50 and the digital receiver and transmitter processing module 64 and 76.

Figure 3:
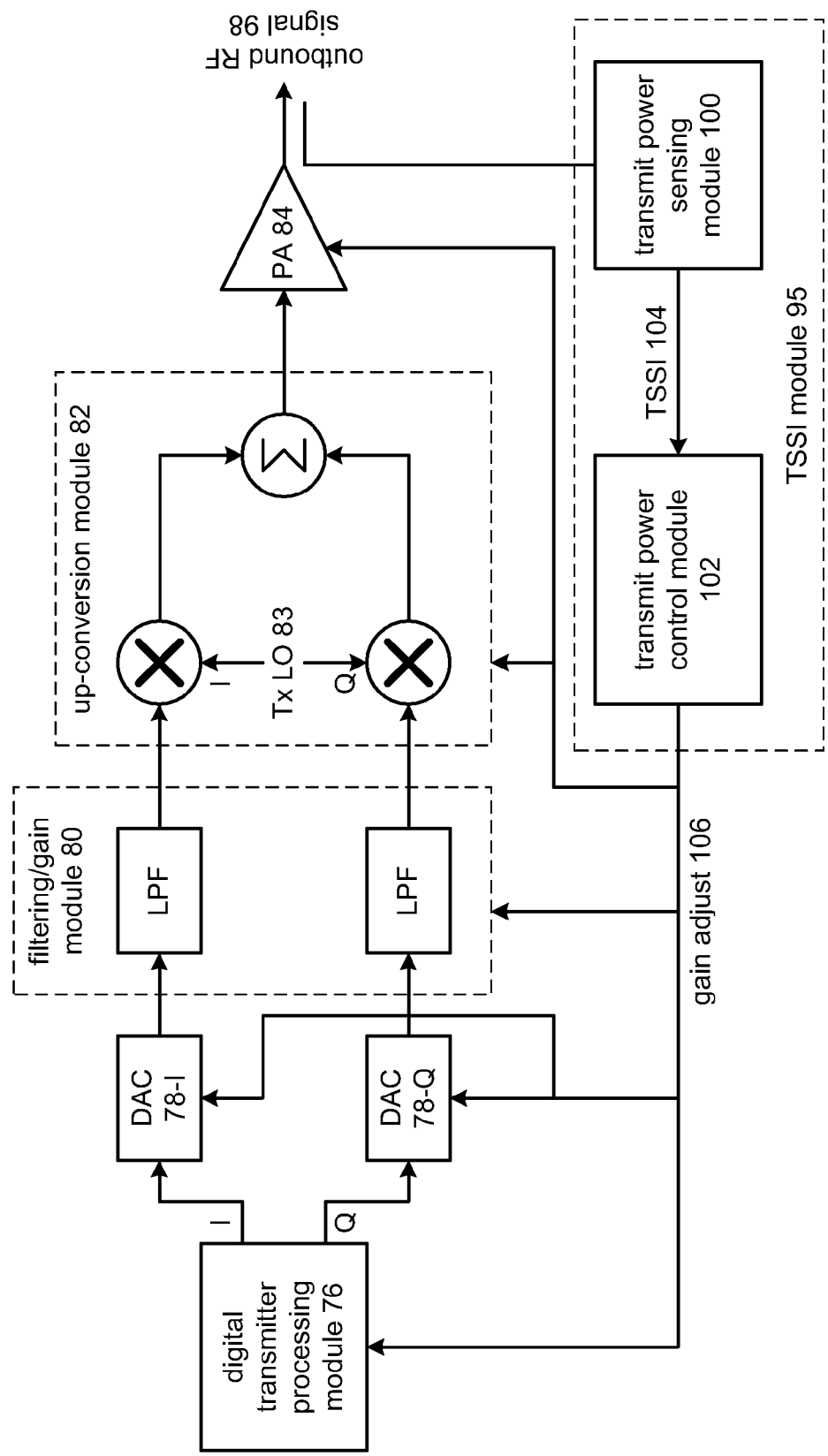
FIG. 3 is a schematic block diagram of an RF transmitter in accordance with the present invention.

FIG. 3 is a schematic block diagram of the RF transmitter section of the wireless communication device in FIG. 2. As shown, the RF transmitter includes the digital transmit processing module 76, complex digital-to-analog inverter 78-I and 78-Q, the filter/gain module 80, the up-conversion module 82, the power amplifier 84, and the TSSI module 95. The filter/gain module 80 includes two low pass filters (LPF). The up-conversion module 82 includes two multipliers, or mixers, and a summation module. The TSSI module 95 includes a transmit power sense module 100 and a transmit power control module 102.

In operation, the digital transmitter processing module 76 converts outbound data into outbound baseband signals, which include an in-phase component (I) and a quadrature component (Q) in accordance with one of a plurality of encoding protocols. For example, if the RF transmitter is supporting IEEE802.11g, the encoding protocols include direct sequence spread spectrum (DSSS), complimentary code keying (CCK) and orthogonal frequency division multiplexing (OFDM). As is known, each of these particular encoding protocols includes multiple data rates. For example, DSSS may have a 1 megabit-per-second data rate or a 2 megabits-per-second data rate, CCK may have a 5.5 or 11 megabits-per-second data rate and OFDM may have a 6, 9, 12, 18, 24, 36, 48, or 54 megabits-per-second data rate. The digital-to-analog converters 78-I and 78-Q convert the in-phase and quadrature baseband signal components into analog signals. The filter/gain module 80 via the low pass filters the in-phase and quadrature baseband signal components and provides them to the up-conversion module 82.

The up-conversion module 82 mixes the in-phase baseband signal components with an in-phase (I) transmit local oscillation 83. The other mixer mixes the quadrature baseband signal components with a quadrature (Q) component of the transmit local oscillation 83. The outputs of the mixers are then summed to produce an RF signal. The power amplifier amplifies the RF signal to produce the outbound RF signals 98.

The transmit power sense module 100 senses the transmit power level of the outbound RF signals 98 and produces a corresponding transmit signal strength indication (TSSI) 104. The transmit power sense module 100 may be implemented in accordance with the teachings of co-pending patent applications:
1. HIGH FREQUENCY SIGNAL POWER DETECTOR, having a filing date Aug. 21, 2003, of and a Ser. No. 10/645,126;
2. HIGH FREQUENCY SIGNAL PEAK DETECTOR, having a filing date of Aug. 21, 2003 and a Ser. No. 10/645,028; and
3. HIGH-SPEED SIGNAL POWER DETECTION CIRCUIT, having a filing date of Aug. 21, 2003 and a Ser. No. 10/645,031.

The transmit power control module 102, which may be a separate processing module, or included within the processing module 76 and/or within processing module 64, interprets the TSSI 104 to produce a gain adjust signal 106. The gain adjust signal 106 may be used to adjust the manner in which the digital transmit processing module 76 encodes the outbound data, the gain of the digital-to-analog converters 78-I and 78-Q, the gain of the low pass filters (LPF), the gain of the mixers of the up-conversion module 82 and/or the gain of the power amplifier 84. Typically, the gain adjust 106 will adjust the gain of the power amplifier 84 and/or of the mixers within the up-conversion module 82. The determination of the gain adjust signal 106 is further based on the encoding protocol 124 as used by the RF transmitter to encode the outbound data to produce the outbound baseband signals via the digital transmit processing module 76. Accordingly, when the encoding protocol 124 corresponds to a lower data rate encoding protocol (e.g., DSSS or CCK) the gain adjust signal will set the gain of the power amplifier or one of the other components at a higher level such that the transmit power is at a $1^{st}$ constant transmit power level (e.g., 17.5 dBm). When the encoding protocol 124 corresponds to a higher data rate (e.g., OFDM), the transmit power control module 102 sets the gain adjust signal 106 such that the transmit power is at a $2^{nd}$ constant power level (e.g., 13.5 dBm).

Figure 4:
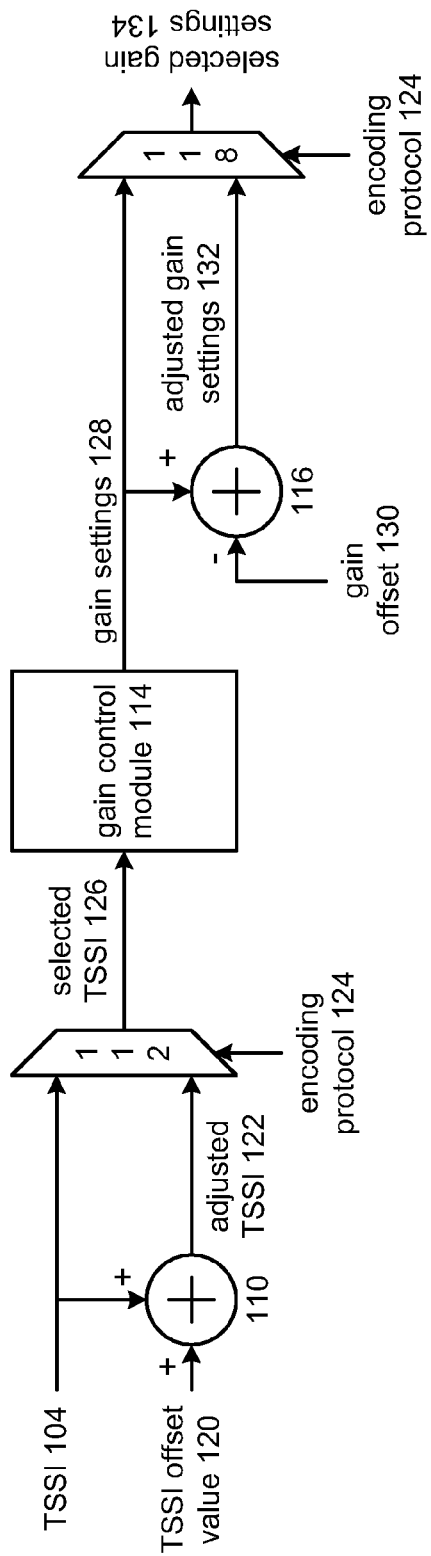
FIG. 4 is a schematic block diagram of the transmit power control module in accordance with the present invention.

FIG. 4 illustrates a schematic block diagram of the transmit power control module 102 that includes a summation module 110, a multiplexer 112, a gain control module 114, a subtraction module 116 and a multiplexer 118. As shown, the TSSI value 104 is received by the summation module 110 and the multiplexer 112. The summation module sums the TSSI value 104 with a TSSI offset value 120 to produce an adjusted TSSI value 122. For instance, the TSSI offset value 120 may correspond to 4 dBm. Depending on the particular encoding protocol 124, the multiplexer outputs a selected TSSI value 126. With reference to the corresponding table, if the encoding protocol 124 is OFDM, the multiplexer 112 will output the adjusted TSSI value and when the encoding protocol 124 corresponds to DSSS or CCK, the multiplexer 112 outputs the TSSI value 104 as the selected TSSI value 126.

The gain control module 114 receives the selected TSSI value 126 and produces a corresponding gain setting 128. Note that the gain control module 114 may be a lookup table that is indexed based on the selected TSSI value 126 to produce the gain setting 128.

The subtraction module 116 subtracts a gain offset 130, which may correspond to the equivalent TSSI offset value 120, to produce an adjusted gain setting 132. Multiplexer 118, based on the particular encoding protocol 124, selects either the gain settings or the adjusted gain settings 132 as the selected gain settings 134. The gain settings affect one or more of the power amplifier, mixers in the up-conversion module, low pass filters, and the digital-to-analog converters. With reference to the accompanying table, in one example, when the encoding protocol 124 is OFDM, the $2^{nd}$ multiplexer 118 outputs the adjusted gain settings 132 to produce the selected gain settings 134. When the encoding protocol 124 is DSSS or CCK, the $2^{nd}$ multiplexer outputs gain settings 128 as the selected gain settings 134.

As one of average skill in the art will appreciate, the transmit power control module 102 regulates the transmit power based on the desired power level for one encoding protocol and adjusts the sensed transmit signal strength indication to normalize its value with respect to the other. Similarly, the particular gain setting is a normalized value for the desired loop and subsequently adjusted for other protocols. As one of average skill in the art will further appreciate, the addition module 110 could be a subtraction module such that it subtracts the TSSI offset value from the sensed TSSI value and subtraction module 116 could be an addition module that adds the gain offset 130 to the gain settings 128. This would be the case if the loop were regulated based on the lower transmit power.

Figure 5:
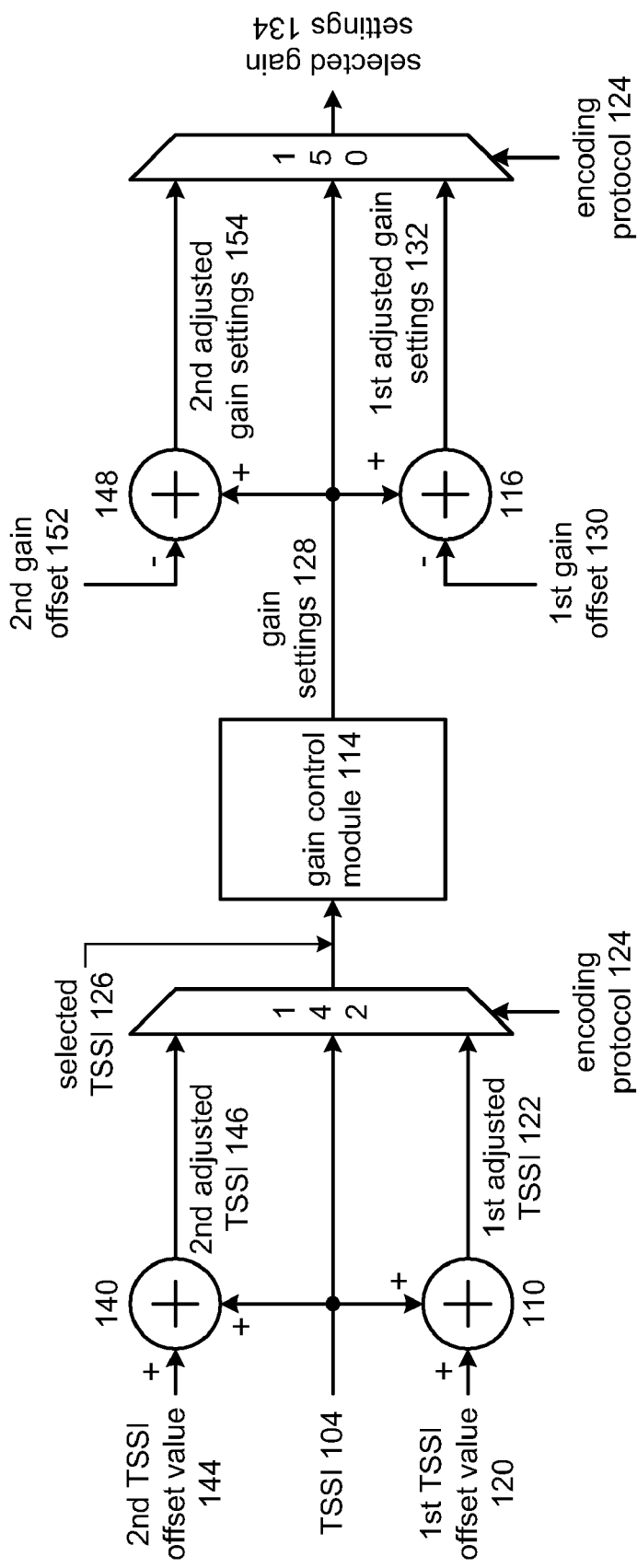
FIG. 5 is a schematic block diagram of another embodiment of a transmit power control module in accordance with the present invention.

FIG. 5 is an alternate schematic block diagram of the transmit power control module 102 that includes a pair of addition modules 110 and 140, a multiplexer 142, a gain control module 114, a pair of subtraction modules 116 and 148 and a $2^{nd}$ multiplexer 150. In this embodiment of the transmit power control module 102, the output power level may be regulated to three levels as opposed to two control levels as produced by the transmit power control module 102 of FIG. 4. In this instance, when a particular encoding protocol 124 is used, one of the TSSI value 104, the $1^{st}$ adjusted TSSI value 122, or the $2^{nd}$ adjusted TSSI value 146 is selected as the selected TSSI value 126. The gain control module 114 produces a corresponding gain setting 128 from the selected TSSI value 126.

Based on the particular encoding protocol 124, the $2^{nd}$ multiplexer 150 outputs either the $2^{nd}$ adjusted gain setting 154, the gain setting 128 or the $1^{st}$ adjusted gain setting 132 as the selected gain setting 134. The $1^{st}$ TSSI value 120 corresponds with the $1^{st}$ gain offset 130 and the $2^{nd}$ TSSI offset value 144 corresponds to the $2^{nd}$ gain offset 154. For example, if the radio frequency transmitter is supporting IEEE802.11g, where the encoding protocols include DSSS, CCK, and OFDM, each of these encoding protocols may have a corresponding constant transmit power level. For example, the OFDM protocol may have a corresponding output transmit power of 13.5 dBm, the CCK encoding protocol may have a corresponding output transmit power level of 15.5 dBm and the DSSS encoding protocol may have a corresponding output transmit power of 17.5 dBm. As one of average skill in the art will appreciate, the particular transmit output power levels may be increased or decreased from the ones referenced here within this example.

Figure 6:
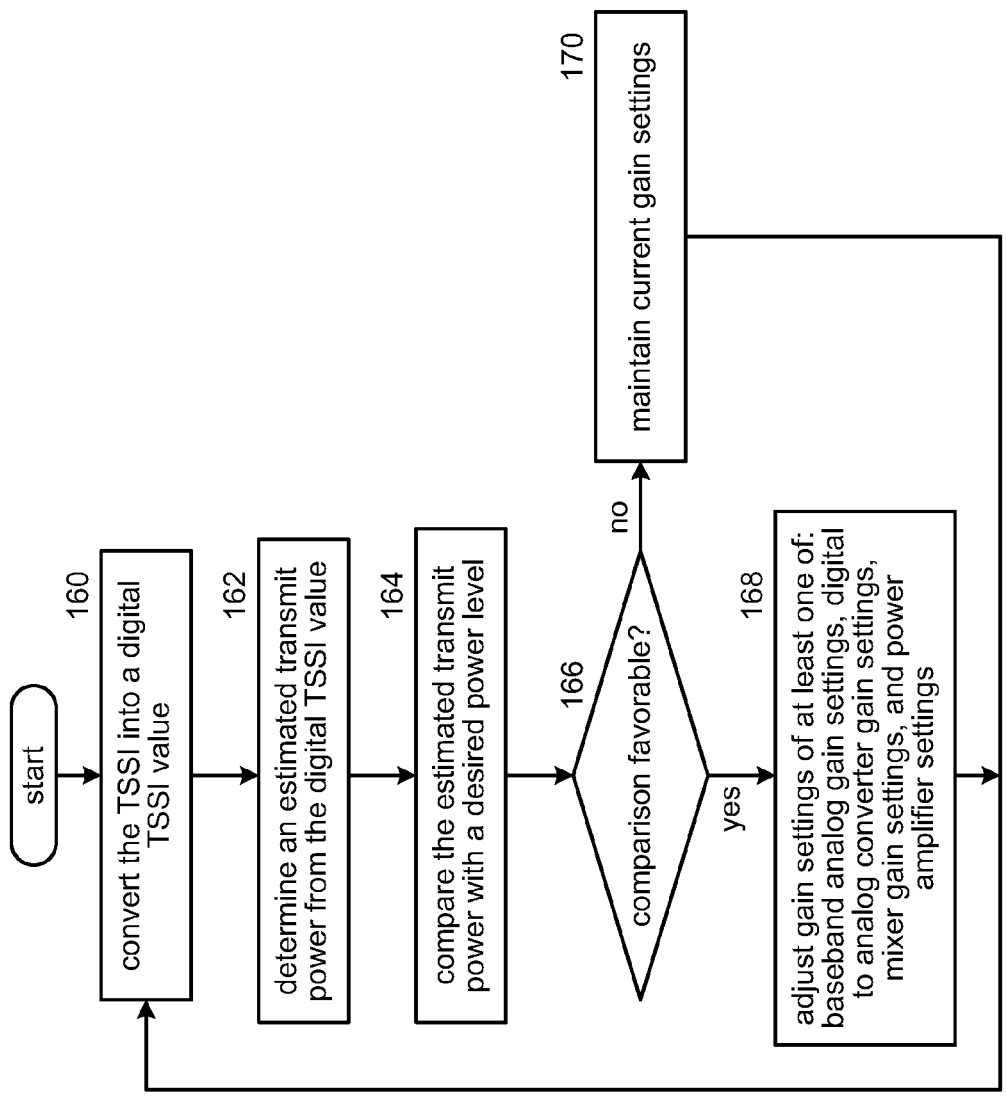
FIG. 6 is a logic diagram of a method for establishing gain settings of an RF transmitter in accordance with the present invention.

FIG. 6 is a logic diagram of the functionality performed by the transmit control module 102 to determine the gain settings 106 from the TSSI value 104. The processing begins at Step 160 where the control module 102 converts the TSSI value into a digital TSSI value. The process then proceeds to Step 162 where the control module determines an estimated transmit power from the digital TSSI value. This may be done by determining the estimated transmit power from the digital TSSI value based on $P_{out\_est}=(b_0+b_1)*TSSI)/(1+a_1)*TSSI$, where $P_{out\_est}$ is the estimated transmit power, $b_0$, $b_1$, and $a_1$ are least square parameters corresponding to functioning of the transmit power sensing module.

The process then proceeds to Step 164 where the estimated transmit power level is compared with a desired power level. The process proceeds to Step 166 where determination is made as to whether the comparison was favorable. If not, the process proceeds to Step 170 where the transmit power control module 102 maintains the current gain settings. If, however, the comparison was favorable, the process proceeds to Step 168 where the control module 102 adjust gain settings of at least one of the baseband analog gain settings, digital-to-analog converter gain settings, mixer gain settings and the power amplifier gain settings such that the estimated transmit power more closely approximates the desired power level.

Figure 7:
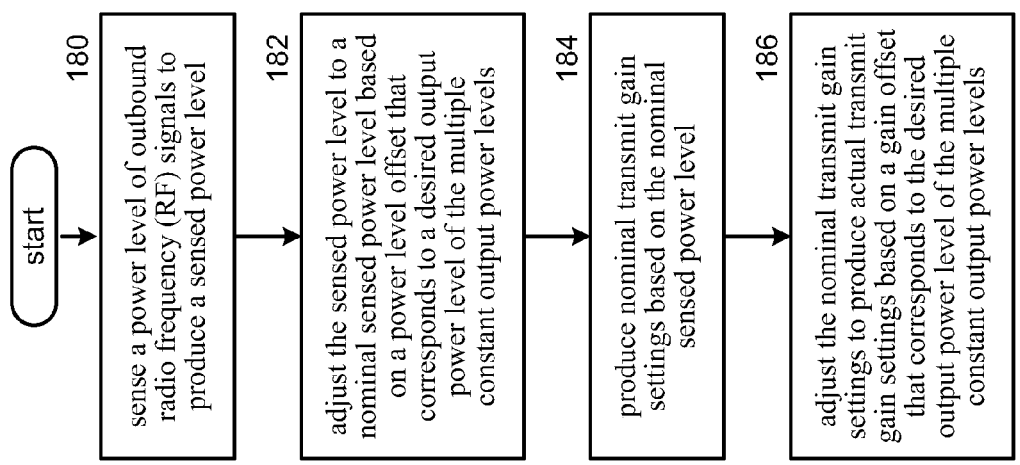
FIG. 7 is a logic diagram of a method for providing multiple constant output power levels for a radio frequency transmitter in accordance with the present invention.

FIG. 7 is a logic diagram of a method for providing multiple constant output power levels for a radio frequency transmitter. The process begins at Step 180 where a power level of outbound radio frequency signals is sensed to produce a sensed power level. The process then proceeds to Step 182 where the sensed power level is adjusted to a nominal sense power level based on a power level offset that corresponds to a desired output level of the multiple constant output power levels. This may be done in a variety of ways. For instance, in one embodiment, the adjusting the sensed power level includes: converting the sensed power level to a transmit signal strength indication (TSSI); adding a TSSI offset value to the TSSI to produce an adjusted TSSI; selecting the TSSI as the nominal sensed power level when an encoding protocol used by the RF transmitter is a first encoding protocol; and selecting the adjusted TSSI as the nominal sensed power level when the encoding protocol used by the RF transmitter is a second encoding protocol; and the adjusting the nominal transmit gain setting includes: subtracting a gain offset from the nominal transmit gain settings to produce adjusted gain settings; selecting the nominal transmit gain settings as the actual transmit gain settings when the encoding protocol used by the RF transmitter is the first encoding protocol; and selecting the adjusted gain settings as the actual transmit gain settings when the encoding protocol used by the RF transmitter is the second encoding protocol.

In another embodiment, Step 182 may include adjusting the sensed power level by: adding a power level offset to the sensed power level to produce an adjusted sensed power level; selecting the sensed power level as a selected sensed power level when an encoding protocol used by the RF transmitter is a first encoding protocol; selecting the adjusted sensed power level as the selected sensed power level when the encoding protocol used by the RF transmitter is a second encoding protocol; and TSSI module operably coupled to convert the selected sensed power level into a transmit signal strength indication (TSSI); and adjusting the nominal transmit gain setting by: producing the nominal transmit gain settings based on the TSSI; subtracting a gain offset from the nominal transmit gain settings to produce adjusted transmit gain settings; selecting the nominal transmit gain settings as the actual transmit gain settings when the encoding protocol used by the RF transmitter is the first encoding protocol; and selecting the adjusted transmit gain settings as the actual transmit gain settings when the encoding protocol used by the RF transmitter is the second encoding protocol.

In yet another embodiment, Step 182 may include adjusting the sensed power level by: converting the sensed power level to a transmit signal strength indication (TSSI); subtracting a TSSI offset value from the TSSI to produce an adjusted TSSI; selecting the adjusted TSSI as the nominal sensed power level when an encoding protocol used by the RF transmitter is a first encoding protocol; and selecting the TSSI as the nominal sensed power level when the encoding protocol used by the RF transmitter is a second encoding protocol; and adjusting the nominal transmit gain setting by: adding a gain offset to the nominal transmit gain settings to produce adjusted gain settings; selecting the adjusted gain settings as the actual transmit gain settings when the encoding protocol used by the RF transmitter is the first encoding protocol; and selecting the nominal transmit gain settings as the actual transmit gain settings when the encoding protocol used by the RF transmitter is the second encoding protocol.

In a further embodiment, Step 182 may include adjusting the sensed power level by: subtracting a power level offset from the sensed power level to produce an adjusted sensed power level; selecting the adjusted sensed power level as a selected sensed power level when an encoding protocol used by the RF transmitter is a first encoding protocol; and selecting the sensed power level as the selected sensed power level when the encoding protocol used by the RF transmitter is a second encoding protocol; and TSSI module operably coupled to convert the selected sensed power level into a transmit signal strength indication (TSSI); The nominal transmit gain setting may be accomplished by: producing the nominal transmit gain settings based on the TSSI; adding a gain offset from the nominal transmit gain settings to produce adjusted transmit gain settings; selecting the adjusted transmit gain settings as the actual transmit gain settings when the encoding protocol used by the RF transmitter is the first encoding protocol; and selecting the nominal transmit gain settings as the actual transmit gain settings when the encoding protocol used by the RF transmitter is the second encoding protocol.

Returning to the logic diagram of FIG. 7, the process continues at Step 184 where a nominal transmit gain setting is produced based on the nominal sense power level. The process then proceeds to Step 186 where the nominal transmit gain setting is adjusted to produce an actual transmit gain setting based on a gain offset that corresponds to the desired output power level of the multiple constant output power levels. This may be accomplished in a variety of ways. For example, this may be done by: converting the nominal sensed power level into a transmit signal strength indication (TSSI); converting the TSSI into a digital TSSI value; determining an estimated transmit power from the digital TSSI value; comparing the estimated transmit power with a desired power level; and when the estimated transmit power compares unfavorably with the desired power level, further adjusting the actual transmit gain settings such that the estimated transmit power more closely approximates the desired power level.

As one of average skill in the art will appreciate, the term "substantially" or "approximately", as may be used herein, provides an industry-accepted tolerance to its corresponding term. Such an industry-accepted tolerance ranges from less than one percent to twenty percent and corresponds to, but is not limited to, component values, integrated circuit process variations, temperature variations, rise and fall times, and/or thermal noise. As one of average skill in the art will further appreciate, the term "operably coupled", as may be used herein, includes direct coupling and indirect coupling via another component, element, circuit, or module where, for indirect coupling, the intervening component, element, circuit, or module does not modify the information of a signal but may adjust its current level, voltage level, and/or power level. As one of average skill in the art will also appreciate, inferred coupling (i.e., where one element is coupled to another element by inference) includes direct and indirect coupling between two elements in the same manner as "operably coupled". As one of average skill in the art will further appreciate, the term "compares favorably", as may be used herein, indicates that a comparison between two or more elements, items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1.

The preceding discussion has presented a method and apparatus for adjusting the output transmit power of a radio frequency transmitter based on the particular encoding protocol used. As one of average skill in the art will appreciate, other embodiments may be derived from the teaching of the present invention without deviating from the scope of the claims.

The invention claimed is:

1. A radio frequency (RF) transmitter having multiple constant output power levels to transmit multiple encoding protocols comprises:
   baseband transmit processing module operably coupled to encode outbound data into outbound baseband signals in accordance with one of a plurality of encoding protocols, wherein each of the plurality of encoding protocols includes multiple data rates;
   mixing module operably coupled to convert the outbound baseband signals into outbound RF signals;
   power amplifier operably coupled to amplify the outbound RF signals prior to transmission to produce amplified outbound RF signals;
   transmit power sensing module operably coupled to sense the amplified outbound RF signals to provide a transmit signal strength indication (TSSI); and
   transmit power control module operably coupled to the transmit power sensing module, the baseband transmit processing module, the mixing module, and the power amplifier, wherein the transmit power control module functions to:
      convert the TSSI into a digital TSSI value;
      determine an estimated transmit power from the digital TSSI value based on $P_{out\_est}=(b_o+b_1*TSSI)/(1+a_1)*TSSI$, where $P_{out\_est}$ is the estimated transmit power, $b_o$ $b_1$ and $a_1$ are least square parameters corresponding to functioning of the transmit power sensing module;
      compare the estimated transmit power with a desired power level; and
      adjust a gain setting of at least one of the baseband transmit processing module, the mixing module, and the power amplifier when the estimated transmit power compares unfavorably with the desired power level, such that the estimated transmit power approximates the desired power level, in order to control power levels when transmitting at a first power level for a first encoding protocol and transmitting at a second power level for a second encoding protocol.

2. The RF transmitter of claim 1, wherein the second encoding protocol is orthogonal frequency division multiplexing (OFDM) and the first encoding protocol is direct sequence spread spectrum (DSSS) or Complementary Coded Keying (CCK).

3. The RF transmitter of claim 1 further comprises:
   the transmit power sensing module including:
      power level sensing module operably coupled to sense the sense the amplified outbound RF signals to provide a sensed power level;
      an adder operably coupled to add a power level offset to the sensed power level to produce an adjusted sensed power level;
      first multiplexer operably coupled to output the sensed power level using the first encoding protocol and to output the adjusted sensed power level using the second encoding protocol to produce a selected sensed power level; and
      TSSI module operably coupled to convert the selected sensed power level into the TSSI;
   the transmit power control module including:
      gain control module operably coupled to produce gain settings for the at least one of the baseband transmit processing module, the mixing module, and the power amplifier based on the TSSI;
      subtraction module operably coupled to subtract a gain offset from the gain settings to produce adjusted gain settings;
      second multiplexer operably coupled to output the gain settings when using the first encoding protocol and to output the adjusted gain settings when using the second encoding protocol.

4. The RF transmitter of claim 1, wherein the second power level is 13.5 dBm when the second encoding protocol is an orthogonal frequency division multiplexing (OFDM) and the first power level is 17.5 dBm when the first encoding protocol is direct sequence spread spectrum or Complementary Coded Keying (CCK).

5. The RF transmitter of claim 1, wherein the transmit power control module comprises:
   subtraction module operably coupled to subtract a TSSI offset value to the TSSI to produce an adjusted TSSI;
   first multiplexer operably coupled to output the adjusted TSSI when using the first encoding protocol and to output the TSSI when using the second encoding protocol to produce a selected TSSI;
   gain control module operably coupled to produce gain settings for the at least one of the baseband transmit processing module, the mixing module, and the power amplifier based on the selected TSSI;
   addition module operably coupled to add a gain offset from the gain settings to produce adjusted gain settings; and
   second multiplexer operably coupled to output the adjusted gain settings when using the first encoding protocol and to output the gain settings when using the second encoding protocol.

6. The RF transmitter of claim 1, wherein the transmit power control module further comprises:
   first adder operably coupled to add a first TSSI offset value to the TSSI to produce a first adjusted TSSI;
   second adder operably coupled to add a second TSSI offset value to the TSSI to produce a second adjusted TSSI;
   first multiplexer operably coupled to output the TSSI when using the first encoding protocol, to output the first adjusted TSSI when using the second encoding protocol, and to output the second adjusted TSSI when using a third encoding protocol to produce a selected TSSI;
   gain control module operably coupled to produce gain settings for the at least one of the baseband transmit processing module, the mixing module, and the power amplifier based on the selected TSSI;

first subtraction module operably coupled to subtract a first gain offset from the gain settings to produce first adjusted gain settings;

second subtraction module operably coupled to subtract a second gain offset from the gain settings to produce second adjusted gain settings; and second multiplexer operably coupled to output the gain settings when using the first encoding protocol, to output the first adjusted gain settings when using the second encoding protocol, and to output the second adjusted gain setting when using the third encoding protocol.

7. A method for providing multiple constant output power levels for a radio frequency (RF) transmitter to transmit multiple encoding protocols, the method comprises:

sensing a power level of outbound radio frequency (RF) signals to produce a transmit signal strength indication (TSSI);

converting the TSSI into a digital TSSI value;

determining an estimated transmit power from the digital TSSI value based on $P_{out\_est}=(b_o+b_1*TSSI)/(1+a_1)*TSSI$, where $P_{out\_est}$ is the estimated transmit power, $b_o$, $b_1$ and $a_1$ are least square parameters corresponding to functions pertaining to sensing the power level;

comparing the estimated transmit power with a desired power level; and adjusting a gain setting of at least one of a baseband transmit processing module, a mixing module, and a power amplifier when the estimated transmit power compares unfavorably with the desired power level such that the estimated transmit power approximates the desired power level, in order to control power levels when transmitting at a first power level for a first encoding protocol and transmitting at a second power level for a second encoding protocol.

8. The method of claim 7 further comprises:

adding a TSSI offset value to the TSSI to produce an adjusted TSSI;

selecting the TSSI as a nominal sensed power level when an encoding protocol used by the RF transmitter is the first encoding protocol; and selecting the adjusted TSSI as the nominal sensed power level when the encoding protocol used by the RF transmitter is the second encoding protocol; and the adjusting the nominal transmit gain setting includes:

subtracting a gain offset from a nominal transmit gain settings to produce adjusted gain settings;

selecting the nominal transmit gain settings as the actual transmit gain settings when the encoding protocol used by the RF transmitter is the first encoding protocol; and selecting the adjusted gain settings as the actual transmit gain settings when the encoding protocol used by the RF transmitter is the second encoding protocol.

9. The method of claim 7 further comprises:

subtracting a power level offset from the sensed power level to produce an adjusted sensed power level;

selecting the adjusted sensed power level as a selected sensed power level when an encoding protocol used by the RF transmitter is the first encoding protocol; and selecting the sensed power level as the selected sensed power level when the encoding protocol used by the RF transmitter is the second encoding protocol; and TSSI module operably coupled to convert the selected sensed power level into the TSSI;

producing a nominal transmit gain settings based on the TSSI;

adding a gain offset from the nominal transmit gain settings to produce adjusted transmit gain settings;

selecting the adjusted transmit gain settings as the actual transmit gain settings when the encoding protocol used by the RF transmitter is the first encoding protocol; and selecting the nominal transmit gain settings as the actual transmit gain settings when the encoding protocol used by the RF transmitter is the second encoding protocol.

* * * * *

UNITED STATES PATENT AND TRADEMARK OFFICE
CERTIFICATE OF CORRECTION

PATENT NO. : 8,233,849 B2  
APPLICATION NO. : 12/392773  
DATED : July 31, 2012  
INVENTOR(S) : Jason A. Trachewsky et al.

Page 1 of 1

It is certified that error appears in the above-identified patent and that said Letters Patent is hereby corrected as shown below:

On the Title Page, Item (75): replace "Cupentino, CA (US)" with --Cupertino, CA (US)--

In the Claims:  
Col. 12, line 4, in claim 3: delete "the sense" before "the amplified"  
Col. 14, line 8, in claim 8: delete "a" before "nominal"  
Col. 14, line 27, in claim 9: delete "a" before "nominal"

Signed and Sealed this  
Ninth Day of April, 2013

Teresa Stanek Rea  
*Acting Director of the United States Patent and Trademark Office*